United States Patent [19]
Wu et al.

[11] Patent Number: 5,658,822
[45] Date of Patent: Aug. 19, 1997

[54] LOCOS METHOD WITH DOUBLE POLYSILICON/SILICON NITRIDE SPACER

[75] Inventors: Shye-Lin Wu, Hsinchu; Hsi-Chuan Chen, Tainan; Ming-Hong Kuo, Pingtung, all of Taiwan

[73] Assignee: Vanguard International Semiconductor Corporation, Hsinchu, Taiwan

[21] Appl. No.: 626,164

[22] Filed: Mar. 29, 1996

[51] Int. Cl.⁶ .................................................. H01L 21/76
[52] U.S. Cl. ........................ 438/446; 438/696; 438/448
[58] Field of Search ................................. 437/69, 70, 72, 437/73

[56] References Cited

U.S. PATENT DOCUMENTS

| | | | |
|---|---|---|---|
| 5,338,968 | 8/1994 | Hodges et al. | 437/69 |
| 5,393,692 | 2/1995 | Wu | 437/69 |
| 5,470,783 | 11/1995 | Chiu et al. | 437/70 |
| 5,512,509 | 4/1996 | Han | 437/70 |

*Primary Examiner*—Trung Dang
*Attorney, Agent, or Firm*—Christensen O'Connor Johnson & Kindness

[57] ABSTRACT

An improved local oxidation of silicon (LOCOS) method with recessed silicon substrate and double polysilicon/silicon nitride spacer is disclosed. The present invention includes forming a pad oxide layer on a semiconductor substrate and then forming a first silicon nitride layer on the pad oxide layer. An active region is defined by patterning and etching the pad oxide layer and the first silicon nitride layer using a photoresist mask. Thereafter, a silicon oxide layer and a second silicon nitride layer is formed. Next, a polysilicon layer is deposited over the second silicon nitride layer. The polysilicon layer, the second silicon nitride layer, and the silicon oxide layer are etched back to form a double polysilicon/silicon nitride spacer. Finally, an isolation region in the substrate is formed.

19 Claims, 5 Drawing Sheets

LOCOS METHOD WITH DOUBLE POLYSILICON/SILICON NITRIDE SPACER

FIELD OF THE INVENTION

The present invention relates to a method for forming isolation regions, and more particularly to an improved local oxidation of silicon (LOCOS) method with recessed silicon and double polysilicon/silicon nitride spacer.

BACKGROUND OF THE INVENTION

The art of isolating semiconductor devices becomes one important aspect of modem metal-oxide-semiconductor (MOS) and bipolar integrated Circuit technology. With increasing densities of up to hundreds of thousands of devices on a single chip, improper isolation among devices will cause current leakages. These current leakages can consume significant amounts of power. In addition, improper isolation between devices can exacerbate latchup, which can damage the circuit temporarily or permanently. Still further, improper isolation can result in noise margin degradation, voltage shift or crosstalk.

In MOS technology, isolation is usually practiced by forming isolation regions between neighboring active regions. Typically, an isolation region is formed by ion-implanting a channel stop layer of polarity opposite to the source electrode and the drain electrode of the integrated circuit device, and growing a thick oxide, often referred to as field oxide (FOX). The channel stop and the FOX cause the threshold voltage in the isolation region to be much higher than those of the neighboring active devices, making surface inversion not likely to occur under the field oxide region.

The local oxidation of silicon (LOGOS) method is also widely used to isolate active regions in silicon. In LOCOS technology, a silicon nitride layer is used as an efficient oxidation mask which prevents the oxidants from reaching the silicon surface covered by silicon nitride. In addition, the silicon nitride layer oxidizes very slowly compared to silicon. However, direct deposition of silicon nitride on silicon can cause stress induced defects when the structure is subjected to oxidation at elevated temperature. These defects can be considerably reduced by forming a thin (100~500 angstroms) pad oxide layer between the silicon and the silicon nitride. The pad oxide reduces the force transmitted to the silicon by relieving the stress. It thus acts as a buffer which cushions the transmission of stress between the silicon and the silicon nitride.

Unfortunately, the pad oxide layer provides a lateral path for oxidation of silicon. This lateral extension of oxidation through pad oxide is frequently referred to as a "bird's beak" because of its form. The extent of the bird's beak can be reduced by decreasing the thickness of the pad oxide, which, however will cause more stress induced defects from the above silicon nitride layer. Therefore, the thickness of the pad oxide and the silicon nitride layer must be optimized to minimize the extent of the bird's beak without generating defects.

Several methods in the prior art have been designed for improving the LOCOS isolation process to minimize the bird's beak. For example, the sealed-interface local oxidation (SILO) process uses an additional thin silicon nitride over the silicon substrate followed by forming a pad oxide layer and then a thick silicon nitride layer. The SILO process can reduce the bird's beak, but at the expense of generating more stress, more crystal defects, and higher leakage currents. See pp. 554–561, of J. Hui, et al., "Sealed-interface local oxidation technology," *IEEE Trans. Electron Devices*, vol. ED-29, 1982.

Another improved LOCOS method, called buried oxide (BOX) process, has been devised which uses an aluminum mask to etch a silicon groove and then subsequently remove a plasma deposited silicon dioxide layer. The BOX process can effectively reduce the bird's beak, but at the expense of manufacture complexity. See pp. 384–387, of K. Kurosawa, et al., "A New Bird's Beak Free Field Isolation Technique for VLSI Devices," *IEDM Tech. Dig.*, 1981.

Beside bird's beak effect, another important limitation is the sharp decrease in the field oxide thickness as the isolation spacing is reduced below 1 micrometer. The narrower the opening, the thinner the field oxide. This effect is frequently called field oxide thinning effect, and is more serious for deep sub-micron semiconductor devices. See p. 671, of A. Bryant, et al., "Characteristics of CMOS Device Isolation for the ULSI Age." *IEDM*, 1994.

SUMMARY OF THE INVENTION

A method for forming an isolation region in a semiconductor ship is disclosed. The method comprises: forming a pad oxide layer on a semiconductor substrate, forming a first silicon nitride layer on the pad oxide layer, patterning and etching the pad oxide layer and the first silicon nitride layer to define an active region by a photoresist mask, forming a thin silicon oxide layer onto said semiconductor substrate, forming a second silicon nitride layer over the first silicon nitride layer and the thin silicon oxide layer, forming a polysilicon layer over the second silicon nitride layer, etching a portion of the polysilicon layer, the second silicon nitride layer and the silicon oxide layer to form a double polysilicon/silicon nitride spacer on the sidewalls of the second silicon nitride layer and the pad oxide layer, and forming an isolation region on the semiconductor substrate with the said spacer serving as a mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
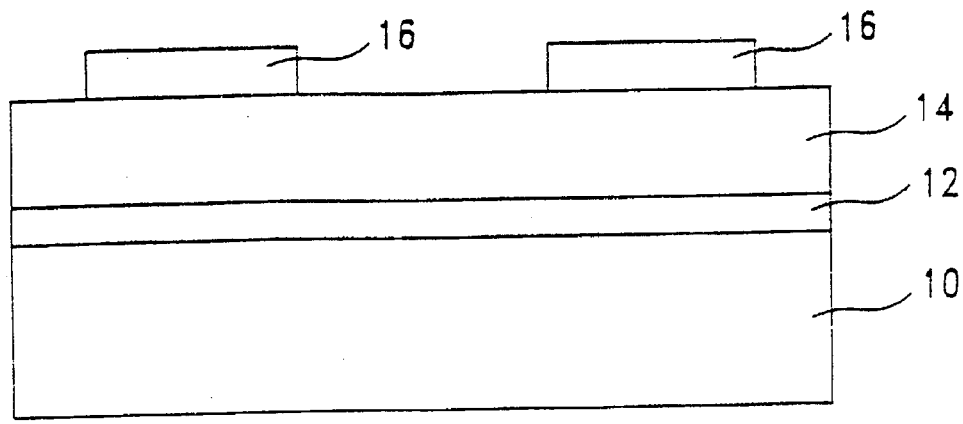
FIGS. 1A to 1I illustrate schematically cross-sectional views of the structure formed at various stages in the fabrication of an isolation region in accordance with the present invention.

FIG. 1A shows a schematic cross-section of a semiconductor substrate 10. A silicon oxide layer 12, having a thickness of 50~350 angstroms, is grown at about 1000° C. in a conventional furnace. Then, a silicon nitride layer 14 is deposited, for example, using a low pressure chemical vapor deposition (LPCVD) process. The silicon nitride layer 14 has a thickness of about 1000~3000 angstroms. The silicon oxide layer 12 is frequently called a pad oxide in isolation technology and is used to reduce the force transmitted from the silicon nitride layer 14 to the substrate 10. The silicon nitride layer 14 is, however, used as an oxidation mask which prevents the oxidants from reaching the substrate 10 under the silicon nitride layer 14 in a later oxidation step. Thereafter, a photoresist masking layer 16 having an active region pattern is formed over the silicon nitride layer 14. This pattern is defined using standard photoresist coating, exposure and development processes.

Figure 1B:
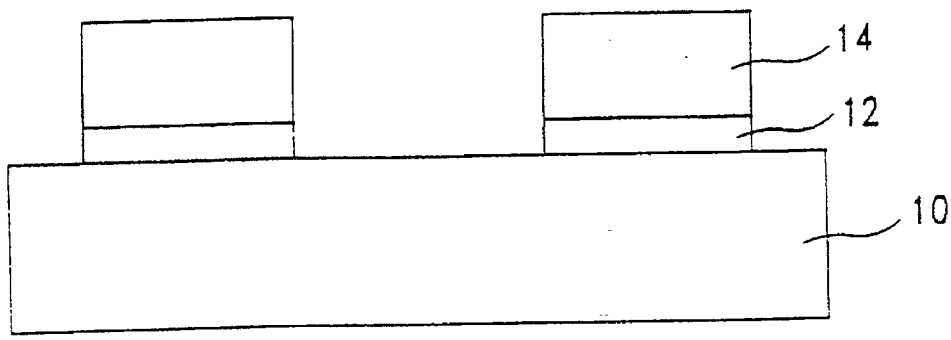

Next, the silicon nitride layer 14 and the pad oxide layer 12 are etched. FIG. 1B shows the structure after etching the silicon nitride layer 14 and the pad oxide 12 anisotropically by using the photoresist pattern 16 as a mask.

Figure 1C:
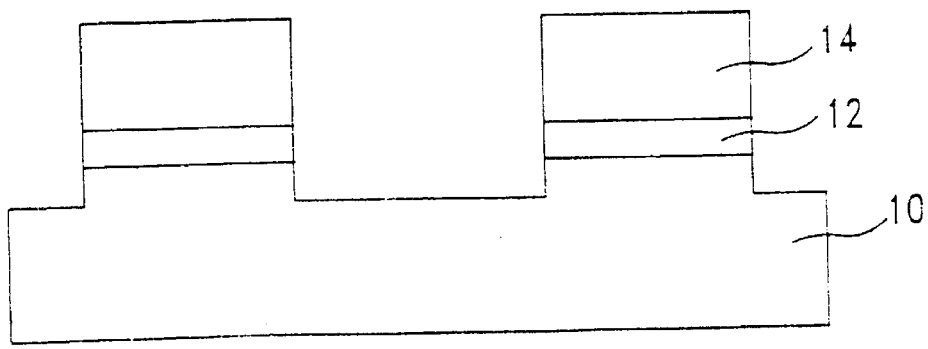

FIG. 1C shows an optional step of etching into the substrate 10 using the patterned silicon nitride layer 14 as a mask. The silicon substrate 10 is recessed from between 0 and 1000 angstroms. This etch process is preferably performed using reactive ion etching or plasma etching. For fabricating deep sub-micron semiconductor devices, which have narrower isolation regions, the recessed substrate can result in thicker field oxides. However, this recessing step can be omitted for those semiconductor devices having isolation spacing larger than 1 micrometer.

Figure 1D:
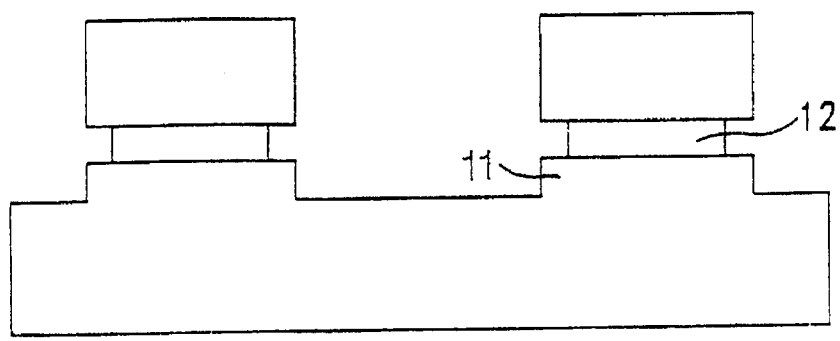

FIG. 1D shows another optional step of an oxide undercut to etch isotropically portions of the pad oxide 12 away. The lateral undercut depth is between 0 and 1000 angstroms. Typically, a wet etchant such as diluted hydrofluoric (HF) solution is used because it has the advantage of dissolving silicon dioxide without attacking silicon and silicon nitride. Practically, the HF is mixed with ammonium fluoride ($NH_4F$), known as a buffered oxide etch (BOE), to slow down the etch rate into a more controllable process. This optional step is utilized to form a step 11 between the silicon substrate 10 and the recessed pad oxide 12, making the deposition of some thin films on the recessed sidewall easier in later steps.

Figure 1E:
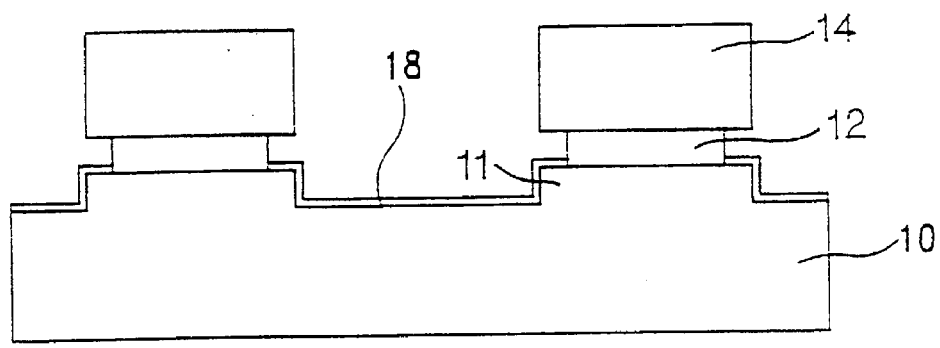

Referring to FIG. 1E, another thin silicon dioxide layer 18 is grown on the silicon substrate 10, having a thickness of about 20~200 angstroms. Noticeably, the recessed oxide layer 12 formed earlier makes the coverage near the step 11 better than that without the recessed oxide layer 12. Further, little silicon oxide is grown on the silicon nitride 14 because the silicon nitride oxidizes very slowly compared to silicon.

Figure 1F:
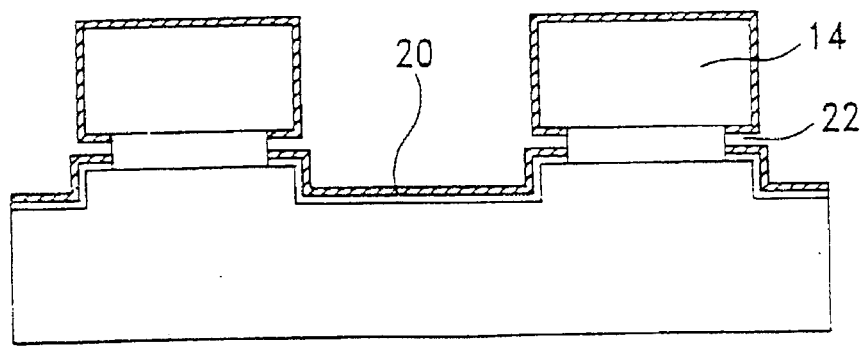

As illustrated in FIG. 1F, another thin silicon nitride layer 20 is deposited using low pressure CVD or ultra-high vacuum CVD. The silicon nitride layer 20 has a thickness less than 200 angstroms. The open gap 22 will be filled up if a thicker silicon nitride layer 20 is applied.

Figure 1G:
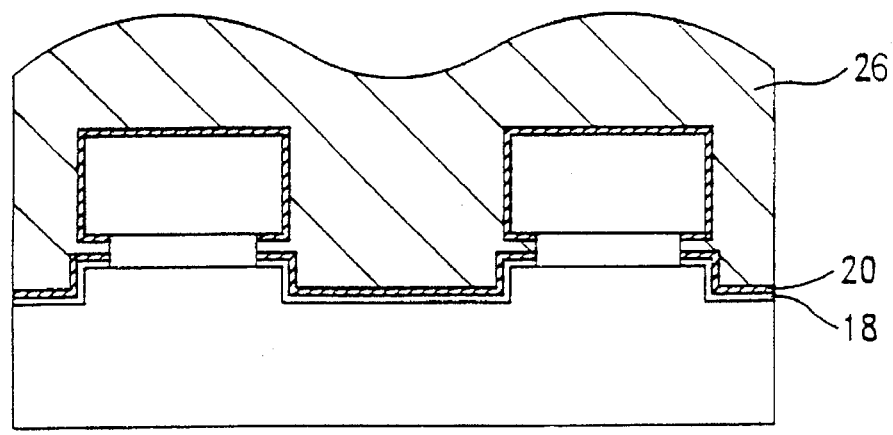
Figure 1H:
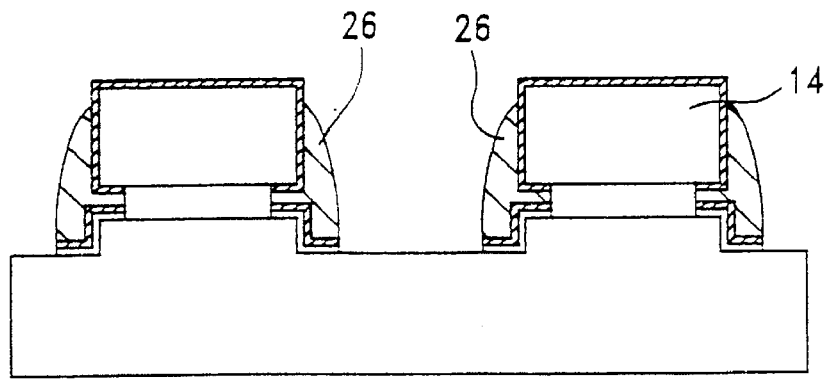

Next, as shown in FIG. 1G, a thick (300~1500 angstroms) polysilicon layer 26 is chemically vapor deposited over the resultant structure of FIG. 1F. Thereafter, the polysilicon layer 26 is etched back using diluted $HF/HNO_3$ to remove portions of the polysilicon layer 26, the thin oxide layer 18 and the thin silicon nitride layer 20. FIG. 1H shows the resulting double polysilicon nitride spacer 26 structure, having the width at bottom of the spacer 26 about 300~1500 angstroms.

Figure 1I:
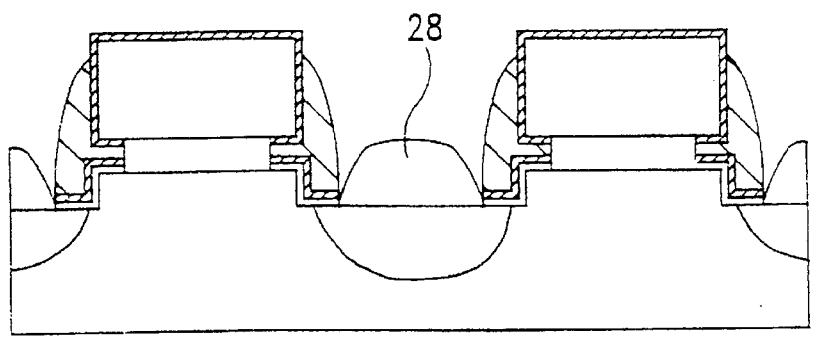

Finally, a field oxide 28, having a thickness of about 3000~10000 angstroms, is grown in a conventional furnace at about 1100° C. as shown in FIG. 1I. Accordingly, a field isolation oxide with little or no bird's beak is achieved by combining conventional LOGOS with double polysilicon nitride spacer technology in the present invention.

The following are two experiments that demonstrate how the present invention reduces the extent of the bird's beak effect empirically. FIGS. 2A to 2D show the first experiment which compares the result of the present invention in FIG. 2D to those of three conventional processes in FIGS. 2A to 2C for forming field isolation region in a furnace at about 1100° C. In the process of FIG. 2A, only a silicon oxide layer 212 having a thickness of 250 angstroms is formed on a silicon substrate 210. For the process of FIG. 2B, a polysilicon layer 224 having a thickness of 1000 angstroms is formed in addition to a silicon oxide layer 222 having the same thickness as that of FIG. 2A. For the process of FIG. 2C, a silicon nitride layer 234 in thickness of 52 angstroms is formed on a silicon oxide layer 232 having the same thickness as that of FIG. 2A. The process of FIG. 2D uses a silicon oxide layer 242 of 250 angstroms in thickness, a silicon nitride layer 244 of 52 angstroms in thickness and a polysilicon layer 246 of 1000 angstroms in thickness. Table 1 lists corresponding field oxide thickness in angstroms for the four processes in FIGS. 2A to 2D.

TABLE 1

Figure 2B:
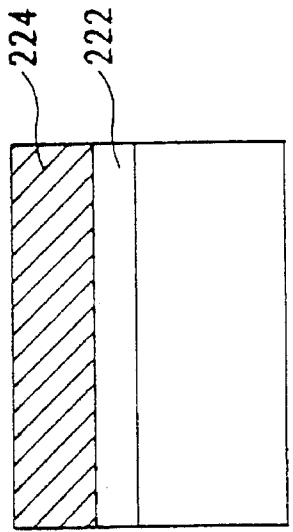
FIGS. 2A to 2D show the first experiment which compares the result of the present invention in FIG. 2D to three other conventional processes in FIGS. 2A to 2C.
Figure 2D:
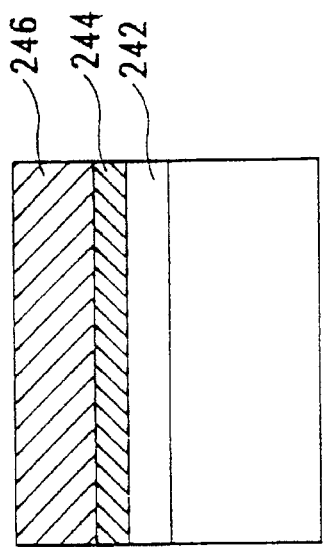
Figure 2A:
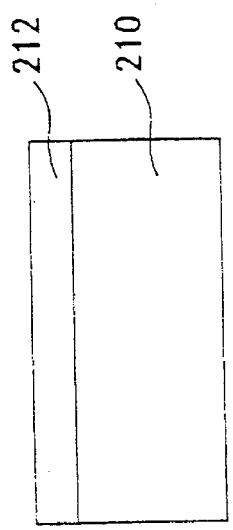
Figure 2C:
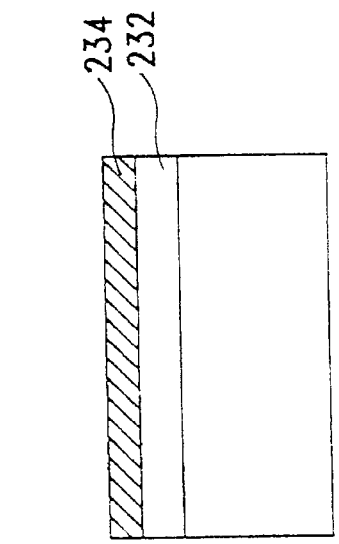

| FIG. 2A | FIG. 2B | FIG. 2C | FIG. 2D |
| --- | --- | --- | --- |
| 4554 | 4811 | 3770 | 2714 |

After the thermal oxidation, a silicon oxide layer will have layer thickness 2.2 times the original thickness. Therefore, the polysilicon layer having a thickness of 1000 angstroms in the beginning will grow into silicon oxide of 2200 angstroms in thickness. Moreover, the silicon nitride layer having a thickness of 52 angstroms in the beginning will grow into silicon oxide of 100 angstroms in thickness.

Using the above, the thickness of a resultant bird's beak can be calculate. For example in the process of FIG. 2D, after subtracting 2200 angstroms due to the polysilicon layer, 250 angstroms due to the original silicon oxide layer and 100 angstroms due to the silicon nitride layer from the total thickness, 2714 angstroms, of the field oxide, the bird's bead is 164 angstroms. The resultant bird's beak thickness in angstroms is shown in Table 2 along with the results of other three processes.

TABLE 2

| FIG. 2A | FIG. 2B | FIG. 2C | FIG. 2D |
| --- | --- | --- | --- |
| 4303 | 2361 | 3420 | 164 |

From the comparison of the present invention to other conventional processes, the present invention considerably reduces the bird's beak effect.

Figure 3:
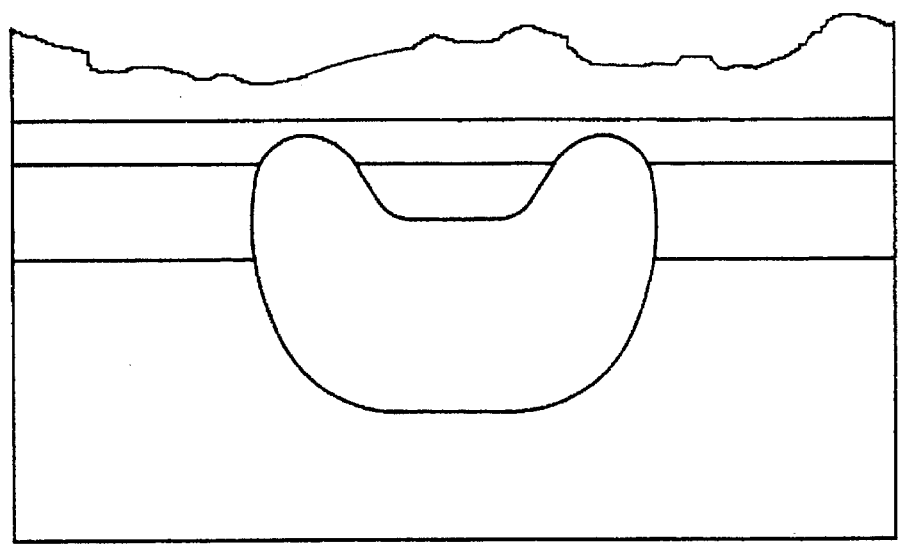
FIG. 3 shows an electro-microscopic graph of the field oxide formed by using the present invention.

FIG. 3 shows an electro-microscopic graph of the field oxide formed by using the process described in FIGS. 1A to 1I. There is very little bird's beak formed using the double polysilicon/silicon nitride spacer of the present invention.

Although specific embodiment has been illustrated and described, it will be obvious to those skilled in the art that various modifications may be made without departing from the spirit which is intended to be limited solely by the appended claims. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method for forming an isolation region, said method comprising:

forming a pad oxide layer on a semiconductor substrate;

forming a first silicon nitride layer on the pad oxide layer;

patterning and etching the pad oxide layer and the first silicon nitride layer to define an active region by a photoresist mask;

removing a portion of the pad oxide layer to form an undercut between the first silicon nitride layer and the substrate;

forming a thin silicon oxide layer onto said semiconductor substrate;

forming a second silicon nitride layer over the first silicon nitride layer and the thin silicon oxide layer;

forming a polysilicon layer over the second silicon nitride layer;

etching a portion of the polysilicon layer, the second silicon nitride layer and the silicon oxide layer to form a double polysilicon/silicon nitride spacer on the sidewalls of the second silicon nitride layer and the pad oxide layer; and forming an isolation region on the semiconductor substrate with said spacer serving as a mask.

2. The method of claim 1 further including the step of:

removing a portion of the substrate after the step of patterning and etching using the patterned first silicon nitride layer as a mask.

3. The method according to claim 2, wherein the thickness of the removed portion of the substrate is between 0 and 1000 angstroms.

4. The method according to claim 1, wherein the lateral depth of the undercut is between 0 and 1000 angstroms.

5. The method according to claim 2, wherein said portion of the substrate is etched using a reactive ion etch (RIE) method.

6. The method according to claim 2, wherein said portion of the substrate is etched using a plasma etch method.

7. The method according to claim 1, wherein said undercut is formed using a wet etch and a diluted hydrofluoric (HF) solution serves as an etchant.

8. The method according to claim 1, wherein said undercut is formed using a wet etch and a buffered oxide etch (BOE) serves as an etchant.

9. The method according to claim 1, wherein said second silicon nitride layer is deposited using a low pressure chemical vapor deposition process.

10. The method according to claim 1, wherein said second silicon nitride layer is deposited using an ultra-high vacuum chemical vapor deposition process.

11. A method for forming an isolation region, said method comprising:

forming a pad oxide layer on a semiconductor substrate;

forming a first silicon nitride layer on the pad oxide layer;

patterning and etching the pad oxide layer and the first silicon nitride layer to define an active region by a photoresist mask;

removing a portion of the substrate using the patterned first silicon nitride layer as a mask;

removing a portion of the pad oxide layer to form an undercut between the first silicon nitride layer and the substrate;

forming a thin silicon oxide layer;

forming a second silicon nitride layer over the first silicon nitride layer and the silicon oxide layer;

forming a polysilicon layer over the second silicon nitride layer;

etching a portion of the polysilicon layer, the second silicon nitride layer and the silicon oxide layer to form a double polysilicon/silicon nitride spacer on the sidewalls of the second silicon nitride layer and the pad oxide layer; and forming an isolation region on the substrate using said spacer as a mask.

12. The method according to claim 11, wherein the thickness of the removed portion of the substrate is between 0 and 1000 angstroms.

13. The method according to claim 11, wherein said portion of the substrate is etched using reactive ion etch (RIE) method.

14. The method according to claim 11, wherein said portion of the substrate is etched using plasma etch method.

15. The method according to claim 11, wherein the lateral depth of the undercut is between 0 and 1000 angstroms.

16. The method according to claim 11, wherein said undercut is formed using a wet etch and a diluted hydrofluoric (HF) solution serves as an etchant.

17. The method according to claim 11, wherein said undercut is formed using a wet etch and a buffered oxide etch (BOE) serves as an etchant.

18. The method according to claim 11, wherein said second silicon nitride layer is deposited using a low pressure chemical vapor deposition process.

19. The method according to claim 11, wherein said second silicon nitride layer is deposited using an ultra-high vacuum chemical vapor deposition process.

* * * * *